United States Patent
Yoo et al.

(10) Patent No.: US 9,425,355 B2
(45) Date of Patent: Aug. 23, 2016

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Kyung Ho Yoo, Incheon (KR); Han Kyu Seong, Seoul (KR); Nam Goo Cha, Ansan-si (KR); Tae Woong Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 227 days.

(21) Appl. No.: 14/161,861

(22) Filed: Jan. 23, 2014

(65) Prior Publication Data

US 2014/0217357 A1 Aug. 7, 2014

(30) Foreign Application Priority Data

Feb. 5, 2013 (KR) .......................... 10-2013-0013113

(51) Int. Cl.
| | |
|---|---|
| *H01L 29/06* | (2006.01) |
| *H01L 31/00* | (2006.01) |
| *H01L 33/24* | (2010.01) |
| *H01L 31/0232* | (2014.01) |

(52) U.S. Cl.
CPC ............. *H01L 33/24* (2013.01); *H01L 31/0232* (2013.01); *H01L 2224/48137* (2013.01)

(58) Field of Classification Search
CPC ..... H01L 33/24; H01L 33/02; H01L 31/0232; H01L 2224/48137
See application file for complete search history.

(56) References Cited

U.S. PATENT DOCUMENTS

| | | | | |
|---|---|---|---|---|
| 6,320,209 B1 * | 11/2001 | Hata | ...................... | B82Y 20/00 257/190 |
| 6,773,943 B2 * | 8/2004 | Oohata | ............... | H01L 25/0753 257/13 |
| 6,881,982 B2 * | 4/2005 | Okuyama | ............... | H01L 33/24 257/103 |
| 8,890,184 B2 * | 11/2014 | Kim | ........................ | H01L 33/24 257/103 |
| 8,921,141 B2 * | 12/2014 | Kryliouk | ............... | H01L 33/007 257/13 |
| 2003/0045042 A1 * | 3/2003 | Biwa | ..................... | H01L 33/007 438/200 |
| 2004/0113166 A1 | 6/2004 | Tadatomo et al. | | |
| 2006/0060833 A1 | 3/2006 | Bruckner et al. | | |
| 2006/0084245 A1 | 4/2006 | Kohda | | |

(Continued)

FOREIGN PATENT DOCUMENTS

| | | |
|---|---|---|
| JP | 2004-247757 A | 9/2004 |
| JP | 2006-114829 A | 4/2006 |

(Continued)

*Primary Examiner* — Zandra Smith
*Assistant Examiner* — John M Parker
(74) *Attorney, Agent, or Firm* — Lee & Morse, P.C.

(57) ABSTRACT

A semiconductor light emitting device including a first conductive semiconductor base layer on a substrate; an insulating layer on the first conductive semiconductor base layer, the insulating layer including a plurality of openings through which the first conductive semiconductor base layer is exposed; and a plurality of nanoscale light emitting structures on the first conductive semiconductor base layer, the nanoscale light emitting structures respectively including a first conductive semiconductor core on an exposed region of the first conductive semiconductor base layer, and an active layer, and a second conductive semiconductor layer sequentially disposed on a surface of the first conductive semiconductor core, wherein a lower edge of a side portion of each nanoscale light emitting structure is on an inner side wall of the opening in the insulating layer.

20 Claims, 9 Drawing Sheets

(56) References Cited

U.S. PATENT DOCUMENTS

2007/0085087 A1* 4/2007 Okuyama ......... H01L 21/02381
257/79
2009/0159869 A1* 6/2009 Ponce ..................... H01L 33/24
257/13
2011/0291072 A1* 12/2011 Kim ........................ H01L 33/08
257/13
2012/0153252 A1* 6/2012 Kim ........................ H01L 33/24
257/13

FOREIGN PATENT DOCUMENTS

| JP | 2006-316307 A | 11/2006 |
| KR | 10-2006-0050820 A | 5/2006 |
| KR | 10-2008-0017174 A | 2/2008 |
| KR | 10-0857410 B1 | 9/2008 |
| KR | 10-2009-0017945 A | 2/2009 |
| KR | 10-2012-0013076 A | 2/2012 |

* cited by examiner

SEMICONDUCTOR LIGHT EMITTING DEVICE

CROSS-REFERENCE TO RELATED APPLICATION

Korean Patent Application No. 10-2013-0013113, filed on Feb. 5, 2013, in the Korean Intellectual Property Office, and entitled: "Semiconductor Lighting Emitting Device," is incorporated by reference herein in its entirety.

BACKGROUND

1. Field

Embodiments relate to a semiconductor light emitting device.

2. Description of the Related Art

A light emitting diode (LED), known as a next generation light source, may have many positive attributes, e.g., a relatively long lifespan, low power consumption, a rapid response rate, environmentally friendly characteristics, or the like, as compared with other light sources. LEDs may be used as a light source in various products, e.g., illumination devices, back light units for display devices, or the like. For example, Group III nitride-based LEDs including GaN, AlGaN, InGaN, InAlGaN, or the like, may be used in semiconductor light emitting devices outputting blue or ultraviolet light.

SUMMARY

Embodiments are directed to a semiconductor light emitting device.

The embodiments may be realized by providing a semiconductor light emitting device including a first conductive semiconductor base layer on a substrate; an insulating layer on the first conductive semiconductor base layer, the insulating layer including a plurality of openings through which the first conductive semiconductor base layer is exposed; and a plurality of nanoscale light emitting structures on the first conductive semiconductor base layer, the nanoscale light emitting structures respectively including a first conductive semiconductor core on an exposed region of the first conductive semiconductor base layer, and an active layer, and a second conductive semiconductor layer sequentially disposed on a surface of the first conductive semiconductor core, wherein a lower edge of a side portion of each nanoscale light emitting structure is on an inner side wall of the opening in the insulating layer.

The inner side wall of the opening may be inclined at a predetermined angle such that a cross sectional area of the opening is gradually increased in an upward direction.

The predetermined angle of the inner side wall may be greater than 15 degrees and less than 75 degrees.

Each nanoscale light emitting structure may include a plurality of semi-polar surfaces.

Each nanoscale light emitting structure may have a hexagonal pyramid shape, and an inclined side portion of the hexagonal pyramid may be a semi-polar surface.

A lower part of each nanoscale light emitting structure may have an inclined side portion of which a cross sectional area is reduced in a growth direction, and an upper part of each nanoscale light emitting structure may have a rod form.

The inclined side portion of the lower part of the nanoscale light emitting structure may be a semi-polar surface.

Each nanoscale light emitting structure may have a rod form.

The inner side wall of the opening may be approximately perpendicular with respect to a surface of the substrate.

Each nanoscale light emitting structure may include a plurality of semi-polar surfaces.

Each nanoscale light emitting structure may have a hexagonal pyramid shape, and an inclined side portion of the hexagonal pyramid may be a semi-polar surface.

A lower part of each nanoscale light emitting structure may have an inclined side portion of which a cross sectional area is reduced in a growth direction, and an upper part of each nanoscale light emitting structure may have a rod form.

The embodiments may also be realized by providing a semiconductor light emitting device including a first conductive semiconductor base layer on a substrate; an insulating layer on the first conductive semiconductor base layer, the insulating layer including a plurality of openings therein and through which the first conductive semiconductor base layer is exposed; and a plurality of nanoscale light emitting structures in the plurality of openings, the nanoscale light emitting structures respectively including a first conductive semiconductor core on the first conductive semiconductor base layer, an active layer, and a second conductive semiconductor layer, wherein an inner side wall of the opening is inclined at a predetermined angle such that a cross-sectional area of the opening is gradually increased in an upward direction, the plurality of nanoscale light emitting structures include a plurality of semi-polar surfaces, and a lower edge of a side portion of each nanoscale light emitting structure is on the inclined inner side wall of the opening.

The predetermined angle of the inner side wall may be greater than 15 degrees and less than 75 degrees.

The nanoscale light emitting structure may have a hexagonal pyramid shape.

The embodiments may also be realized by providing a semiconductor light emitting device including a first conductive semiconductor base layer on a substrate; an insulating layer on the first conductive semiconductor base layer, the insulating layer including a plurality of openings overlying the first conductive semiconductor base layer; and a plurality of nanoscale light emitting structures on the first conductive semiconductor base layer in the openings, the nanoscale light emitting structures each including a first conductive semiconductor core on the first conductive semiconductor base layer, an active layer on the first conductive semiconductor core, and a second conductive semiconductor layer on the active layer, wherein a lower edge of a side portion of each nanoscale light emitting structure contacts an inner side wall of the opening in the insulating layer.

At least one of the side portion of each nanoscale light emitting structure or the inner side wall of the opening in the insulating layer may be inclined with respect to a plane of an upper surface of the substrate.

Both of the side portion of each nanoscale light emitting structure and the inner side wall of the opening in the insulating layer may be inclined with respect to the plane of the upper surface of the substrate.

The inner side wall of the opening may be inclined at a predetermined angle with respect to the plane of the upper surface of the substrate such that a cross sectional area of the opening is gradually increased in a direction away from the substrate, and the predetermined angle of the inner side wall may be greater than 15 degrees and less than 75 degrees.

Each nanoscale light emitting structure may include a plurality of semi-polar surfaces.

BRIEF DESCRIPTION OF THE DRAWINGS

Features will be apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Figure 1:
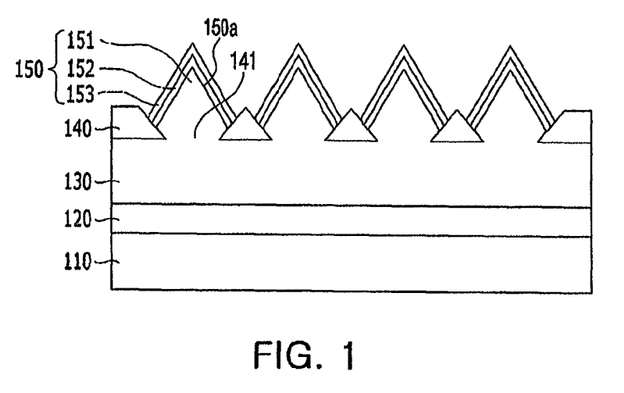
FIG. 1 illustrates a cross-sectional view of a semiconductor light emitting device including a nanoscale light emitting structure according to an embodiment.

FIG. 1 illustrates a cross-sectional view of a semiconductor light emitting device including a nanoscale light emitting structure according to an embodiment.

With reference to FIG. 1, a semiconductor light emitting device 100 according to an embodiment may include a substrate 110, a first conductive semiconductor base layer 130 on the substrate 110, an insulating layer 140, and a nanoscale light emitting structure 150. The nanoscale light emitting structure 150 may include a first conductive semiconductor core 151 (formed through growth of the first conductive semiconductor base layer 130), an active layer 152, and a second conductive semiconductor layer 153.

Unless explicitly described otherwise, the terms 'upper part', 'upper surface', 'lower part', 'lower surface', 'side surface', and the like, used herein are used based on the drawings, and may actually be different depending on a direction in which a device is actually disposed in use.

The substrate 110 may be a semiconductor growth substrate, and may be formed using an insulating, conductive, semiconductor material, e.g., sapphire, SiC, $MgAl_2O_4$, MgO, $LiAlO_2$, $LiGaO_2$, GaN, or the like. In an implementation, in the case of sapphire, widely used as a material for a nitride semiconductor growth substrate, sapphire may be a crystal having Hexa-Rhombo R3c symmetry, and may have respective lattice constants of 13.001 Å and 4.758 Å in c-axis and a-axis directions, and may have a C (0001) plane, an A (1120) plane, an R (1102) plane and the like. In this case, the C plane may comparatively facilitate growth of a nitride thin film and may stable at relatively high temperatures. Thus, the C plane may mainly be used as a growth substrate for a nitride semiconductor. In an implementation, a Si substrate may be used as the substrate 110. The Si substrate may be appropriate for obtaining a substrate having a large diameter and may have relatively low manufacturing costs. Thus, mass production thereof may be enhanced. When the Si substrate is used, a buffer layer 120 (formed of a material such as $Al_xGa_{1-x}N$) may be formed on the substrate 110, and a nitride semiconductor having a desired structure may be subsequently grown thereon.

For example, the buffer layer 120 may be additionally formed on the substrate 110 (before the first conductive semiconductor base layer 130 is formed) in order to help improve crystalline properties of the first conductive semiconductor base layer 130. The buffer layer 120 may be formed by, e.g., growing $Al_xGa_{1-x}N$ at a relatively low temperature without doping.

In the present embodiment, the first conductive semiconductor base layer 130 may be commonly connected to one side of respective ones of the nanoscale light emitting structures 150 having common polarities, to thus serve as a contact structure on one side thereof, as well as providing a crystal plane for growth of the core 151 of the light emitting structure 150.

The first conductive semiconductor base layer 130 may be formed of or may include a group III-V compound. In an implementation, the first conductive semiconductor base layer 130 may be formed of gallium nitride (GaN), e.g., n-type GaN. The first conductive semiconductor base layer 130 may be doped with an n-type impurity. In an implementation, the n-type impurity may be a group V element, e.g., Si.

The insulating layer 140 may be formed on the first conductive semiconductor base layer 130. In an implementation, the insulating layer 140 may be formed of a silicon oxide or a silicon nitride. In an implementation, the insulating layer 140 may include, e.g., any one of $SiO_x$, $SiO_xN_y$, $Si_xN_y$, $Al_2O_3$, TiN, AlN, ZrO, TiAlN, and TiSiN, a combination thereof, or the like. The insulating layer 140 may include a plurality of openings 141 through which portions of the first conductive semiconductor base layer 130 are exposed.

The nanoscale light emitting structures 150 may be respectively formed in locations corresponding to the plurality of openings 141.

The nanoscale light emitting structure 150 employed in the present embodiment may be a nanoscale light emitting structure having a core-shell structure. For example, the nanoscale light emitting structure 150 may include a core that includes the first conductive semiconductor core 151 (grown from a region of the first conductive semiconductor base layer 130 exposed through the opening 141). The nanoscale light emitting structure 150 may include a shell that includes, e.g., the active layer 152 and the second conductive semiconductor layer 153 sequentially formed on a surface of the first conductive semiconductor core 151.

The opening 141 of the present embodiment may have an inclined inner side wall that is inclined at a predetermined angle with respect to a plane of an upper surface of the substrate 110. For example, the inner side wall of the opening may have an inclined structure such that a cross sectional area of the opening is gradually increased in an upward direction, e.g., in a direction away from the substrate 110. The inner side wall of the opening 141 may be inclined to have an internal angle (θ), with regard to the plane of the upper surface of the substrate 110, of e.g., greater than 15 degrees and less than 75 degrees.

The first conductive semiconductor core 151 and the second conductive semiconductor layer 153 may be configured of or include a semiconductor doped with an n-type impurity and a semiconductor doped with a p-type impurity, respectively. However, the embodiments are not limited thereto. For example, the first conductive semiconductor core 151 and the second conductive semiconductor layer 153 may be configured of or include a semiconductor doped with a p-type impurity and a semiconductor doped with an n-type impurity, respectively.

As described above, in the present embodiment, the active layer and the second conductive semiconductor layer may be provided as the shell structure of a nanoscale light emitting structure, e.g., of the core-shell structure.

The active layer 152 may be formed on a surface of the first conductive semiconductor core 151. In an implementation, the active layer 152 may be a layer formed of a single material, e.g., InGaN or the like, or the active layer 152 may have a multiple quantum well (MQW) structure in which a quantum barrier layer and a quantum well layer are alternately stacked, which may be respectively formed of GaN and InGaN. The active layer 152 may generate light energy by the combination of electrons and holes.

The second conductive semiconductor layer 153 may be formed on a surface of the active layer 152. The second conductive semiconductor layer 153 may be formed of or include, e.g., a group III-V compound. The second conductive semiconductor layer 153 may be p-doped. Here, the p-doping may indicate group II element doping. In an implementation, the second conductive semiconductor layer 153 may be doped with an Mg impurity. In an implementation, the second conductive semiconductor layer 153 may be or include a GaN layer. In an implementation, the second conductive semiconductor layer 153 may be or include a p-GaN layer. Holes may move through the second conductive semiconductor layer 153 to the active layer 152.

As such, in a case in which the first conductive semiconductor core 151, the active layer 152, and the second conductive semiconductor layer 153 are formed using a nitride single crystal, the nanoscale light emitting structure 150 may include a plurality of semipolar surfaces (an r plane) 150a. The semipolar surface 150a may include a surface inclined with respect to the substrate 110. The nanoscale light emitting structure 150 as described above may have a polygonal pyramid shape, e.g., a hexagonal pyramid shape. In the nanoscale light emitting structure 150 formed as described above, a content of In contained in the InGaN active layer may be increased. Thus, a defect in a crystallinity due to a lattice mismatch may be reduced, thereby increasing quantum efficiency.

According to the present embodiment, a lower edge of a side portion of the nanoscale light emitting structure 150 (configured of the first conductive semiconductor core 151, the active layer 152, and the second conductive semiconductor layer 153 sequentially formed on the surface of the first conductive semiconductor core 151) may be positioned on an inner side wall of the opening 141 in the insulating layer 140.

For example, in a case in which the inner side wall of the opening 141 in the insulating layer 140 is inclined, a lower edge of the side portion of the nanoscale light emitting structure 150 may contact the inclined inner side wall of the opening 141 in the insulating layer 140.

As such, when the lower edge of the side portion of the nanoscale light emitting structure 150 contacts the inner side wall of the opening 141 in the insulating layer 140, a difference in growth rates of the respective first conductive semiconductor core 151, the active layer 152, and the second conductive semiconductor layer 153 (due to differences in the sizes of exposed areas thereof) may not occur during the growth process of the nanoscale light emitting structure 150 (including the semipolar surface 150a inclined with regard to the substrate 110).

In addition, the nanoscale light emitting structure 150 may be grown within the opening of the insulating layer 140. Thus, delamination between the nanoscale light emitting structure 150 and the insulating layer 140 (due to a difference in degrees of stress applied to the interior and the exterior of the opening 141 in the insulating layer 140 during a process of growing the nanoscale light emitting structure 150) may not occur. For example, a gap between the insulating layer 140 and the nanoscale light emitting structure 150 may not be formed. Therefore, the occurrence of a leakage current (due to a gap between the insulating layer 140 and the nanoscale light emitting structure 150 when power is applied to a semiconductor light emitting device including the nanoscale light emitting structure 150) may be reduced and/or prevented.

Further, a difference in terms of sizes of exposed areas between an interior and an exterior of the opening 141 in the insulating layer 140 may not occur, such that a quantum well layer and the quantum barrier layer may be uniformly grown, whereby internal quantum efficiency may not be reduced.

Although FIG. 1 illustrates the case in which the insulating layer 140 has a triangular cross section, various forms may be applied according to embodiments. For example, the insulating layer may have an inclined side portion form.

Figure 2:
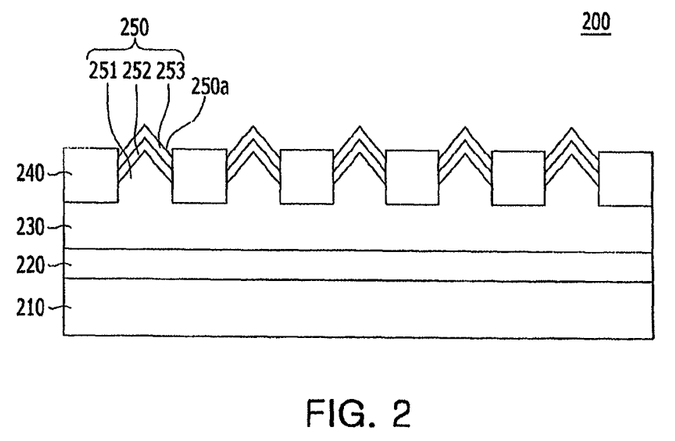
FIG. 2 illustrates a cross-sectional view of a semiconductor light emitting device including a nanoscale light emitting structure according to another embodiment.

FIG. 2 illustrates a cross-sectional view of a semiconductor light emitting device including a nanoscale light emitting structure according to another embodiment.

As shown in FIG. 2, a semiconductor light emitting device 200 according to another embodiment may be the same as the semiconductor light emitting device 100 according to the afore-mentioned embodiment in the configurations, except for the shape of the insulating layer.

The semiconductor light emitting device 200 according to the present embodiment may include a substrate 210, a first conductive semiconductor base layer 230 on the substrate 210, an insulating layer 240, and a nanoscale light emitting structure 250. The nanoscale light emitting structure 250 may include a first conductive semiconductor core 251 (formed through growth of the first conductive semiconductor base layer 230), an active layer 252, and a second conductive semiconductor layer 253). In addition, a buffer layer 220 may be formed on the substrate 210 before the first conductive semiconductor base layer 230 is formed.

As shown in FIG. 2, the nanoscale light emitting structure 250 may be inside the opening of the insulating layer 240. For example, a lower edge of a side portion of the nanoscale light emitting structure 250 may contact an approximately vertical inner side wall of the opening of the insulating layer 240.

As described above, when the nanoscale light emitting structure 250 including the first conductive semiconductor core 251, the active layer 252, and the second conductive semiconductor layer 253 is formed inside the opening of the insulating layer 240, a difference in growth rates (due to a difference in sizes of exposed areas of the respective first conductive semiconductor core 251, the active layer 252, and the second conductive semiconductor layer 253) may not occur in the growth process of the nanoscale light emitting structure 250 (including a semipolar surface 250a inclined with regard to the substrate 210). In addition, the nanoscale light emitting structure 250 may be grown within the opening of the insulating layer 240. Thus, a delamination phenomenon between the nanoscale light emitting structure 250 and the insulating layer 240 (which may otherwise occur due to a difference in degrees of stress applied to the interior and the exterior of the opening of the insulating layer 240) may be reduced and/or prevented. For example, a gap between the insulating layer 240 and the nanoscale light emitting structure 250 may not be formed. Therefore, the occurrence of a leakage current (due to a gap between the insulating layer 240 and the nanoscale light emitting structure 250) when power is applied to a semiconductor light emitting device including the nanoscale light emitting structure 250 may be reduced and/or prevented.

In addition, a difference between the interior and the exterior of the opening of the insulating layer 240 in terms of sizes of exposed areas may not occur, such that a quantum well layer and a quantum barrier layer may be uniformly grown, whereby internal quantum efficiency may not be reduced.

Figure 3:
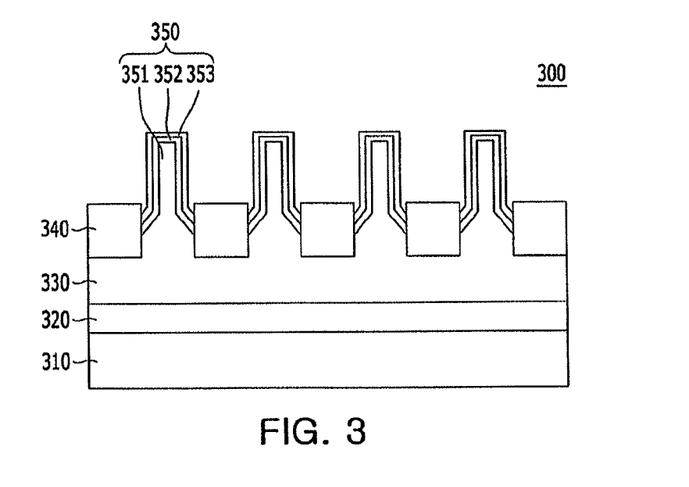
FIG. 3 illustrates a cross-sectional view of a semiconductor light emitting device including a nanoscale light emitting structure according to another embodiment.

FIG. 3 illustrates a cross-sectional view of a semiconductor light emitting device including a nanoscale light emitting structure according to another embodiment.

With reference to FIG. 3, a semiconductor light emitting device 300 according to another embodiment may include a substrate 310, a first conductive semiconductor base layer 330 on the substrate 310, an insulating layer 340, and a nanoscale light emitting structure 350. The nanoscale light emitting structure 350 may include a first conductive semiconductor core 351 formed through growth of the first conductive semiconductor base layer 330, an active layer 352, and a second conductive semiconductor layer 353. In addition, a buffer layer 320 may be formed on the substrate 310 before the first conductive semiconductor base layer 330 is formed.

In FIG. 3, a lower edge of a side portion of the nanoscale light emitting structure 350 may contact an approximately vertical inner side wall of an opening of the insulating layer 340. In the present embodiment, a lower part of the nanoscale light emitting structure 350 may have an inclined side portion, of which a cross sectional area in a growth direction thereof (e.g., in a direction away from the substrate 310) is reduced. An upper part of the nanoscale light emitting structure 350 may have a rod form or shape. When the nanoscale light emitting structure 350 is formed of a nitride single crystal, the inclined side portion of the lower part of the nanoscale light emitting structure 350 may be a semipolar surface (an r plane). A side portion of an upper part of the nanoscale light emitting structure 350 may be a non-polar surface (an m plane).

As such, when an inner side wall of the opening in the insulating layer 340 contacts a lower edge of a side portion of the nanoscale light emitting structure 350 (configured of the first conductive semiconductor core 351, the active layer 352, and the second conductive semiconductor layer 353), the nanoscale light emitting structure 350 may be grown inside the opening of the insulating layer 340. Thus, a delamination phenomenon between the nanoscale light emitting structure 350 and the insulating layer 340 (which may otherwise occur due to a difference in degrees of stress applied to the interior and the exterior of the opening of the insulating layer 340) may be reduced and/or prevented. For example, a gap between the insulating layer 340 and the nanoscale light emitting structure 350 may not be formed. Therefore, the occurrence of a leakage current (due to a gap between the insulating layer 340 and the nanoscale light emitting structure 350 when power is applied to a semiconductor light emitting device including the nanoscale light emitting structure 350) may be reduced and/or prevented.

Figure 4A:
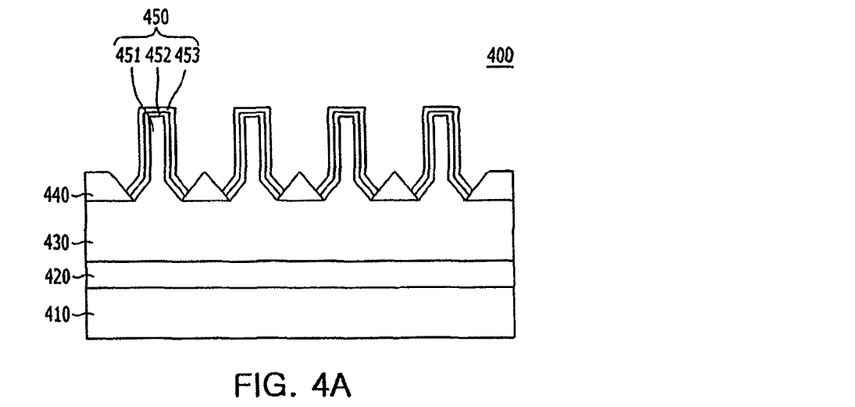
FIGS. 4A and 4B illustrate cross-sectional views of a semiconductor light emitting device including a nanoscale light emitting structure according to embodiments.
Figure 4B:
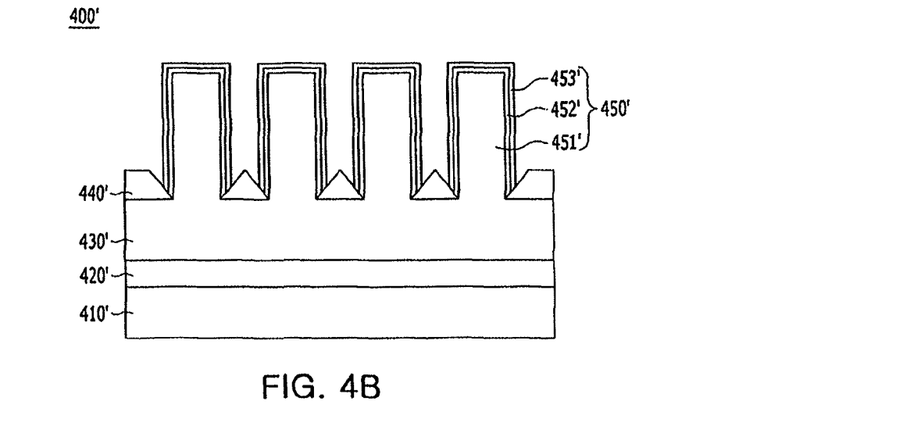

FIGS. 4A and 4B illustrate cross-sectional views of a semiconductor light emitting device including a nanoscale light emitting structure according to embodiments. Insulating layers 440 and 440' of the present embodiments may have a triangular cross-section similar to that of the insulating layer shown in FIG. 1.

First, referring to FIG. 4A, a semiconductor light emitting device 400 according to an embodiment may include a substrate 410, a first conductive semiconductor base layer 430 on the substrate 410, an insulating layer 440, and a nanoscale light emitting structure 450. The nanoscale light emitting structure 450 may include a first conductive semiconductor core 451 formed through growth of the first conductive semiconductor base layer 430, an active layer 452 and a second conductive semiconductor layer 453. In addition, a buffer layer 420 may be formed on the substrate 410 before the first conductive semiconductor base layer 430 is formed.

In FIG. 4A, a lower edge of a side portion of the nanoscale light emitting structure 450 may contact an inclined inner side wall of an opening of the insulating layer 440. The inner side wall of the opening may have an inclined structure in which cross sectional areas of the opening are gradually increased in an upward direction, e.g., in a direction away from the substrate 410. The inner side wall of the opening may be inclined to have an internal angle (θ) with respect to a plane of an upper surface of the substrate 410 of, e.g., greater than 15 degrees and less than 75 degrees.

In the present embodiment, a lower part of the nanoscale light emitting structure 450 may have an inclined side portion (of which cross sections in a growth direction thereof are reduced), and an upper part of the nanoscale light emitting structure 450 may have a rod form. When the nanoscale light emitting structure 450 is formed of a nitride single crystal, the inclined side portion of the lower part of the nanoscale light emitting structure 450 may be a semipolar surface (an r plane). A side portion of an upper part of the nanoscale light emitting structure 450 may be a non-polar surface (an m plane).

As such, when an inner side wall of the opening formed in the insulating layer 440 contacts a lower edge of a side portion of the nanoscale light emitting structure 450 (configured of the first conductive semiconductor core 451, the active layer 452, and the second conductive semiconductor layer 453), a delamination phenomenon between the nanoscale light emitting structure 450 and the insulating layer 440 (which may otherwise occur due to a difference in degrees of stress applied to the interior and the exterior of the opening of the insulating layer 440) may be reduced and/or prevented. For example, a gap between the insulating layer 440 and the nanoscale light emitting structure 450 may not be formed. Therefore, occurrence of a leakage current (due to a gap between the insulating layer 440 and the nanoscale light emitting structure 450 when power is applied to a semiconductor light emitting device including the nanoscale light emitting structure 450) may be prevented.

As shown in FIG. 4B, a semiconductor light emitting device 400' according to an embodiment may include a substrate 410', a first conductive semiconductor base layer 430' on the substrate 410', an insulating layer 440', and a nanoscale light emitting structure 450'. The nanoscale light emitting structure 450' may include a first conductive semiconductor core 451' formed through growth of the first conductive semiconductor base layer 430', an active layer 452', and a second conductive semiconductor layer 453'. In addition, a buffer layer 420' may be formed on the substrate 410' before the first conductive semiconductor base layer 430' is formed, e.g., similar to the semiconductor light emitting device 400 according to the afore-mentioned embodiment with reference to FIG. 4A.

The insulating layer 440' of the present embodiment may also have a structure similar to that of the insulating layer 440 of the afore-mentioned embodiment with reference to FIG. 4A. For example, in the insulating layer 440', an inner side wall of the opening may have an inclined structure such that cross sectional areas of the opening are gradually increased in an upward direction, e.g., in a direction away from the substrate 410'. The inner side wall of the opening may be inclined to have an internal angle ($\theta$) with respect to a plane of an upper surface of the substrate 410' of, e.g., greater than 15 degrees and less than 75 degrees.

In the present embodiment, a lower edge of a side portion of the nanoscale light emitting structure 450' may contact the inclined inner side wall of the opening (similar to the afore-mentioned embodiment with reference to FIG. 4A). However, the nanoscale light emitting structure 450' of the present embodiment may have a different form in terms of an overall structure. For example, as shown in FIG. 4B, an upper part or an entirety of the nanoscale light emitting structure 450' of the present embodiment may have a rod form. This form may be obtained by, e.g., controlling growth conditions of the first conductive semiconductor core 451'. When the nanoscale light emitting structure is formed of a nitride single crystal, a side portion of the nanoscale light emitting structure 450' may be a non-polar surface (an m plane).

As described above, even when the insulating layer 440' has a form identical to that of the insulating layer 440 of the afore-mentioned embodiment with reference to FIG. 4A, the nanoscale light emitting structure 450' according to the present embodiment may have a rod form in which sizes of cross sections thereof in the growth direction may be approximately uniform by controlling growth conditions.

For example, in the present embodiment, a lower edge of a side portion of the nanoscale light emitting structure 450' (configured of the first conductive semiconductor core 451', the active layer 452', and the second conductive semiconductor layer 453') may contact an inner side wall of an opening in the insulating layer 440'. The inner side wall of the opening may have an inclined structure such that cross sectional areas of the opening are gradually increased in an upward direction, e.g., in a direction away from the substrate 410'.

By realizing the structure as described above, a structure in which a delamination phenomenon (between the nanoscale light emitting structure 450' and the insulating layer 440' occurring due to a difference in degrees of stress applied to the interior and the exterior of the opening of the insulating layer 440') may not fundamentally occur, may be applied thereto. As such, occurrence of a leakage current may be effectively prevented by realizing a nanoscale semiconductor light emitting device in which a gap between the insulating layer 440' and the nanoscale light emitting structure 450' may not be formed.

Although the above-mentioned embodiments with reference to FIGS. 1 to 4B do not specifically describe an electrode, the nanoscale light emitting structure according to embodiments may be applied to various type semiconductor light emitting devices having the same.

FIGS. 5A to 5D illustrate stages in a process of manufacturing a semiconductor light emitting device including a nanoscale light emitting structure on an insulating layer.

Figure 5A:
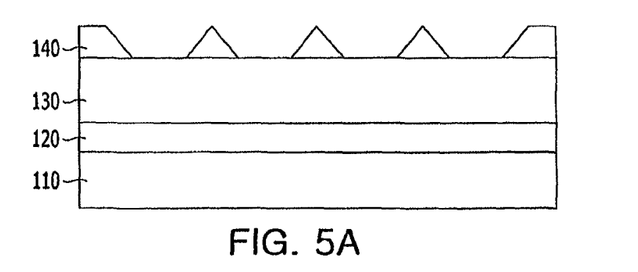
FIGS. 5A to 5D illustrate stages in a process of manufacturing a semiconductor light emitting device including a nanoscale light emitting structure on an insulating layer.

With reference to FIG. 5A, the buffer layer 120, the first conductive semiconductor base layer 130 and the insulating layer 140 may be formed on the substrate 110.

The insulating layer 140 may include the opening 141 (see FIG. 1) having an inner side wall inclined at a predetermined angle with respect to a plane of an upper surface of the substrate 110. For example, the inner side wall of the opening may have an inclined structure such that cross sectional areas of the opening increase in an upward direction or a direction away from the substrate 110. The inner side wall of the opening may have an internal angle ($\theta$) with respect to the plane of the upper surface of the substrate 110 of, e.g., greater than 15 degrees and less than 75 degrees.

Figure 5B:
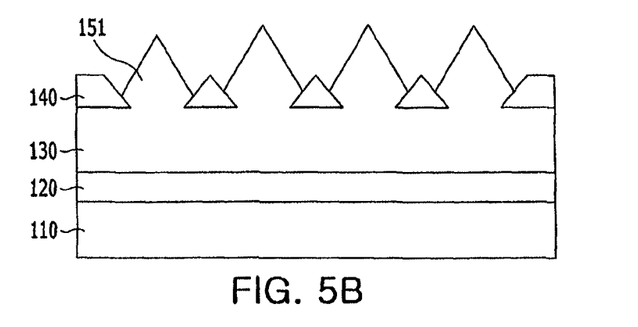

Subsequently, with reference to FIG. 5B, the first conductive semiconductor core 151 may be grown on the first conductive semiconductor base layer 130 exposed through the insulating layer 140 including the opening 141 having an inclined inner side wall, to a point on the inner side wall of the insulating layer 140.

For example, in the process described above, a gallium supply source, trimethyl gallium (TMGa) of about 10 to about 200 sccm, and ammonia ($NH_3$) gas of about 15,000 to about 20,000 sccm may be supplied to a reaction furnace provided with the substrate 110 while a temperature thereof is maintained at about 900° C. to about 1,100° C., and deposition thereof on a side portion of the insulating layer 140 to a predetermined height, e.g., about 50 to about 100 nm, may be performed for about 1 to about 5 minutes at a temperature of about 1,000° C. to about 1,100° C.

Then, an amount of TMGa, the gallium supply source, may be reduced to about 50 to about 150 sccm, and an amount of ammonia ($NH_3$) gas may be reduced to about 500 to about 5,000 sccm, such that the first conductive semiconductor core 151 may be grown at a temperature of about 900 to about 1,100° C.

Figure 5C:
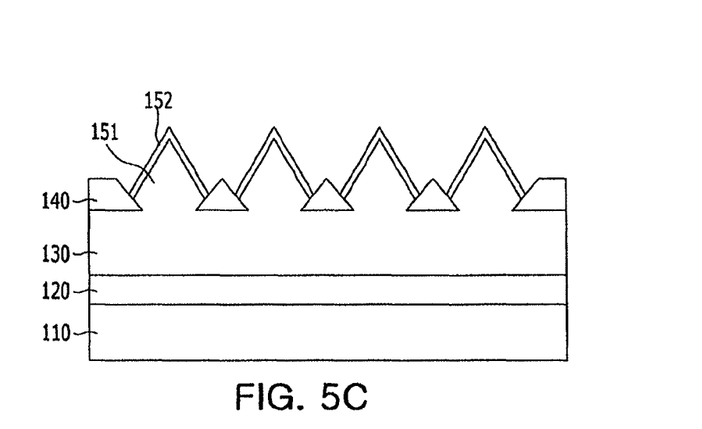

Subsequently, with reference to FIG. 5C, the active layer 152 may be formed on a surface of the first conductive semiconductor core 151. The active layer 152 may be formed in the opening 141 such that a lower edge of a side portion of the active layer 152 contacts an inclined inner side wall of the opening 141.

For example, the active layer 152 may be formed at a temperature lower than a temperature at which the first conductive semiconductor core 151 is formed by about 100° C. to about 300° C.

Figure 5D:
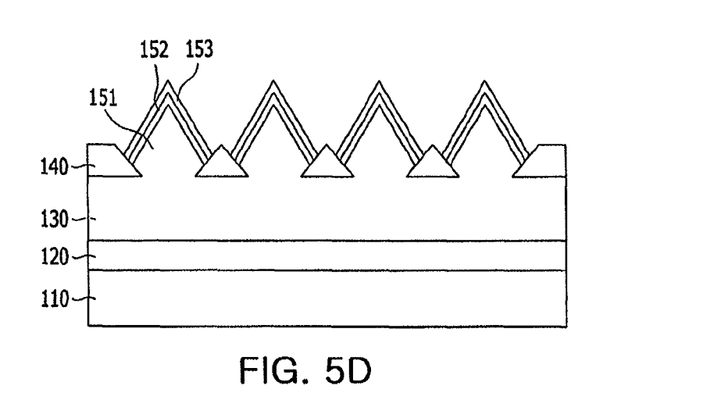

Next, with reference to FIG. 5D, the second conductive semiconductor layer 153 may be formed on the active layer 152 to cover a surface thereof. The second conductive semiconductor layer 153 may be formed such that a lower edge of a side portion of the second conductive semiconductor layer 153 contacts an inclined inner side wall of the opening 141.

Figure 6:
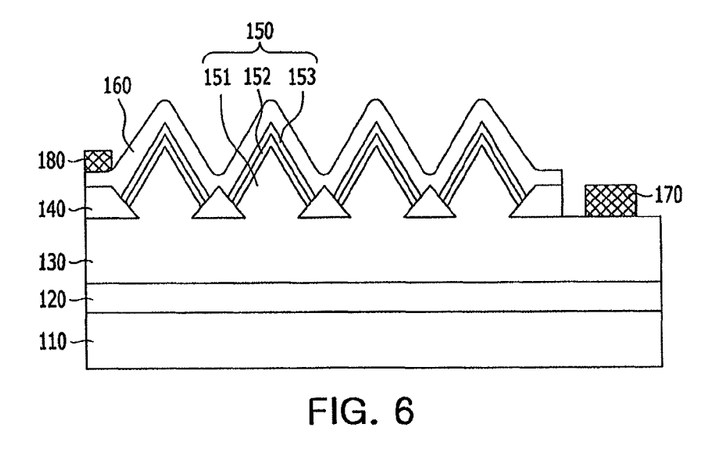
FIG. 6 illustrates a cross-sectional view of a structure in which the semiconductor light emitting device including a nanoscale light emitting structure shown in FIG. 1 includes an electrode.

FIG. 6 illustrates a cross-sectional view of a structure in which the semiconductor light emitting device including a nanoscale light emitting structure according to the embodiment with reference to FIG. 1 includes an electrode. Constituent elements of FIG. 6 may be the same as those of FIG. 1 except for further including an electrode in FIG. 1.

As shown in FIG. 6, a semiconductor light emitting device may include a substrate 110, a buffer layer 120, a first conductive semiconductor base layer 130 on the substrate 110 or the buffer layer 120, an insulating layer 140, a nanoscale light emitting structure 150 (including a first conductive semiconductor core 151 extended from the first conductive semiconductor base layer 130, an active layer 152, and a second conductive semiconductor layer 153), a transparent electrode 160, and electrodes 170 and 180.

The electrodes may be first and second electrodes 170 and 180 electrically connected to the first conductive semiconductor base layer 130 and the second conductive semiconductor layer 153, respectively.

In addition, the light emitting device may further include a transparent electrode 160 on the second conductive semiconductor layer 153. The transparent electrode 160 may electrically connect the second conductive semiconductor layers 153 (individually provided on the substrate 110) to one another. Further, the transparent electrode 160 may be disposed along an outer circumferential surface of the second conductive semiconductor layers 153 such that a current may be uniformly diffused on an entire surface of the second conductive semiconductor layers 153. For example, the transparent electrode 160 may increase a current receiving area. A material forming the transparent electrode 160 may include, e.g., ITO (Indium Tin Oxide), TO (Tin Oxide), IZO (Indium Zinc Oxide), ITZO (Indium Tin Zinc Oxide), TCO (Transparent Conductive Oxide), or AZO (Aluminum Zinc Oxide).

Here, the first electrode 170 may be formed on a portion of the first conductive semiconductor base layer 130 that exposed by etching portions of the transparent electrode 160 and the insulating layer 140. In addition, the second electrode 180 may be on the transparent electrode 160 to thus form a light emitting device having a horizontal structure.

Therefore, the semiconductor light emitting device may be formed such that a lower edge of a side portion of the nanoscale light emitting structure 150 contacts an inner side wall of the opening in the insulating layer 140, thereby reducing the likelihood of and/or preventing delamination between the nanoscale light emitting structure 150 and the insulating layer 140. Therefore, occurrence of a leakage current (due to a gap between the insulating layer 140 and the nanoscale light emitting structure 150 when power is applied to a semiconductor light emitting device including the nanoscale light emitting structure 150) may be reduced and/or prevented.

Further, a difference in sizes of exposed areas between the interior and the exterior of the opening 141 in the insulating layer 140 may not occur. Thus, a quantum well layer and a quantum barrier layer of the active layer 152 may be uniformly grown, whereby internal quantum efficiency may not be reduced.

Although the present embodiment describes a semiconductor light emitting device having a horizontal structure, it should not be considered to be limiting. For example, embodiments may be applied to semiconductor light emitting devices having various structures such as flip-chip type semiconductor light emitting devices or the like. Here, in the case of the flip-chip type semiconductor light emitting device, the second conductive semiconductor layer 153 may include a reflective electrode 160 formed of Ag or Al formed thereon.

Figure 7:
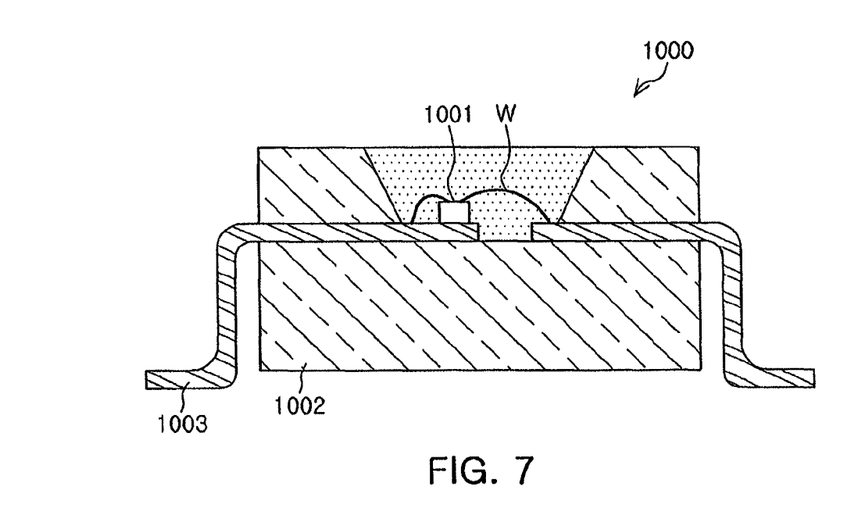
FIGS. 7 and 8 illustrate an example in which a semiconductor light emitting device according to an embodiment is applied to a package.
Figure 8:
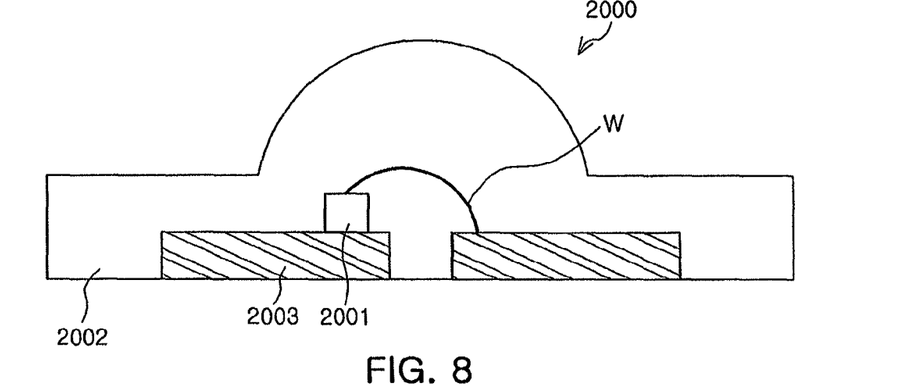

FIGS. 7 and 8 illustrate an example in which a semiconductor light emitting device according to an embodiment is applied to a package. A package 1000 shown in FIG. 7 may include a semiconductor light emitting device 1001, a package body 1002, and a pair of lead frames 1003. The semiconductor light emitting device 1001 may be mounted on the lead frame 1003 to be electrically connected to the lead frame 1003 through a wire W. The semiconductor light emitting device 1001 may also be mounted on other regions instead of the lead frame 1003, e.g., on the package body 1002. As shown in FIG. 7, the package body 1002 may have a cup shape to help improve light reflection efficiency. Such a reflective cup may be filled with a light transmitting material encapsulating the semiconductor light emitting device 1001, the wire W, and the like. As described above, the semiconductor light emitting device 1001 may have a structure including a nanoscale light emitting structure. In addition, a single wire W may be used or may not be necessary depending on an electrode type of the semiconductor light emitting device 1001, a mounting type thereof, or the like.

A package 2000 shown in FIG. 8 is similar to the aforedescribed package structure in that a semiconductor light emitting device 2001 is disposed on a lead frame 2003, and electrical conduction thereof is formed through the wire W. The package 2000 shown in FIG. 8 may differ therefrom in that a lower surface of the lead frame 2003 may be exposed to the exterior to be good for radiation of heat, and a shape of the package 2000 may be kept by a light transmitting body 2002 encapsulating the lead frame 2003. The semiconductor light emitting device 2001 may have the structure as described above, and although FIG. 8 illustrates the case in which a single wire W is used, a number of wires W may be changed depending on an electrode type of the semiconductor light emitting device 2001, a mounting type thereof, or the like.

Figure 9:
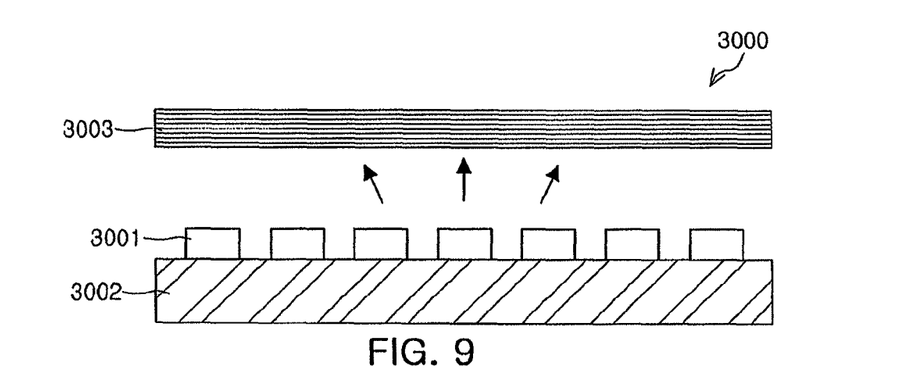
FIGS. 9 and 10 illustrate an example in which a semiconductor light emitting device according to an embodiment is applied to a back light unit.
Figure 10:
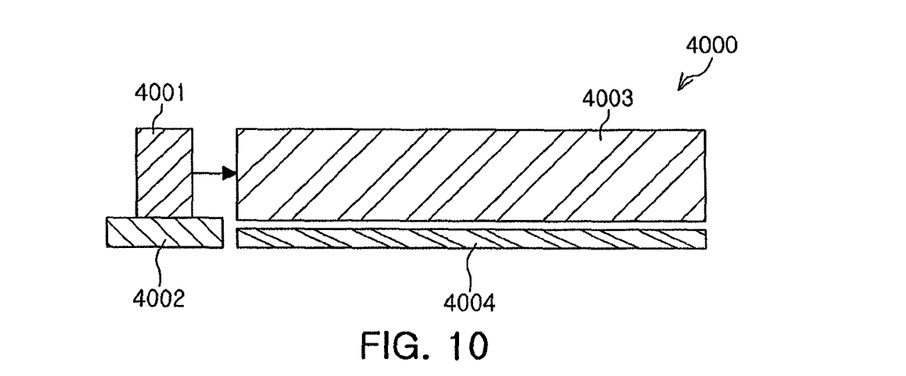

FIGS. 9 and 10 illustrate an example in which a semiconductor light emitting device according to an embodiment is applied to a back light unit. With reference to FIG. 9, a back light unit 3000 may include a light source 3001 mounted on a substrate 3002, and at least one optical sheet 3003 disposed thereon. In the light source 3001, a light emitting device package having the afore-described structure or a structure similar thereto may be used. In addition, a semiconductor light emitting device may be directly mounted on the substrate 3002 (a so-called chip on board (COB) mounting manner). In the back light unit 3000 of FIG. 9, the light source 3001 may emit light upwardly in a direction in which a liquid crystal display device is disposed, while in a back light unit 4000 of another example illustrated in FIG. 10, a light source 4001 mounted on a substrate 4002 may emit light in a lateral direction such that the emitted light may be incident onto a light guiding panel 4003 to be converted into a form of surface light source type light. Light passing through the light guiding panel 4003 may be discharged in an upward direction, and a reflective layer 4004 may be disposed below the light guiding panel 4003 to help improve light extraction efficiency.

Figure 11:
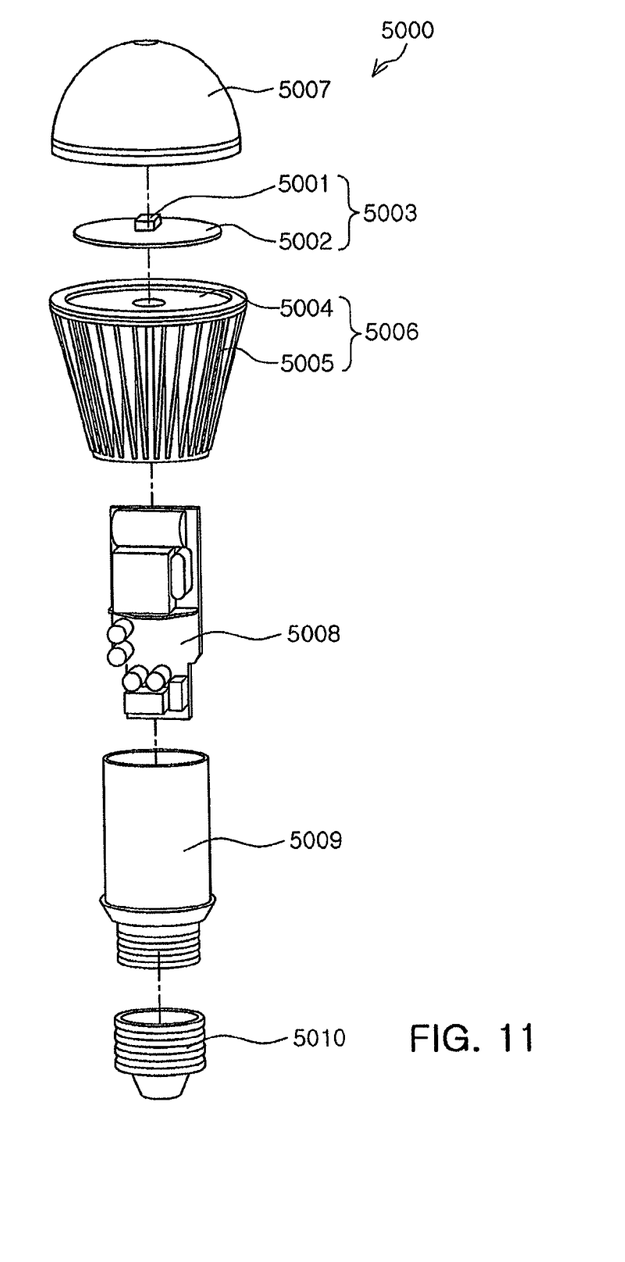
FIG. 11 illustrates an example in which a semiconductor light emitting device according to an embodiment is applied to an illumination device.

FIG. 11 illustrates an example in which a semiconductor light emitting device according to an embodiment is applied to an illumination device. With reference to an exploded perspective view of FIG. 11, an illumination device 5000 may be a bulb type lamp by way of example. The illumination device 5000 may include a light emitting module 5003, a driving unit 5008, and an external connection unit 5010. In addition, the illumination device 5000 may further include a structure of appearance such as external and internal housings 5006 and 5009 and a cover unit 5007. The light emitting module 5003 may include the semiconductor light emitting device 5001 described above and a circuit board 5002 on which the light emitting device 5001 is mounted. Although the present embodiment is described in reference a case in which a single semiconductor light emitting device 5001 is mounted on the circuit board 5002, a plurality of semiconductor light emitting devices 5001 may be mounted on the circuit board 5002 as desired. In addition, instead of directly mounting the semiconductor light emitting device 5001 on the circuit board 5002, the semiconductor light emitting device 5001 may be manufactured as a package type light emitting device and then mounted.

In addition, in the illumination device 5000, the light emitting module 5003 may include the external housing 5006 serving as a heat radiating unit. The external housing 5006 may include a heat radiating plate 5004 directly contacting the light emitting module 5003 to help improve a heat radiation effect. In addition, the illumination device 5000 may include the cover unit 5007 mounted on the light emitting module 5003 and having a convex lens shape. The driving unit 5008 may be installed in the internal housing 5009 to be connected to the external connection unit 5010 having a structure such as a socket structure so as to receive power from an external power supply. In addition, the driving unit 5008 may convert the received power into a current source suitable for driving the semiconductor light emitting device 5001 to then be supplied. For example, the driving unit 5008 may be configured of an AC to DC converter, a rectifying circuit component, or the like.

Figure 12:
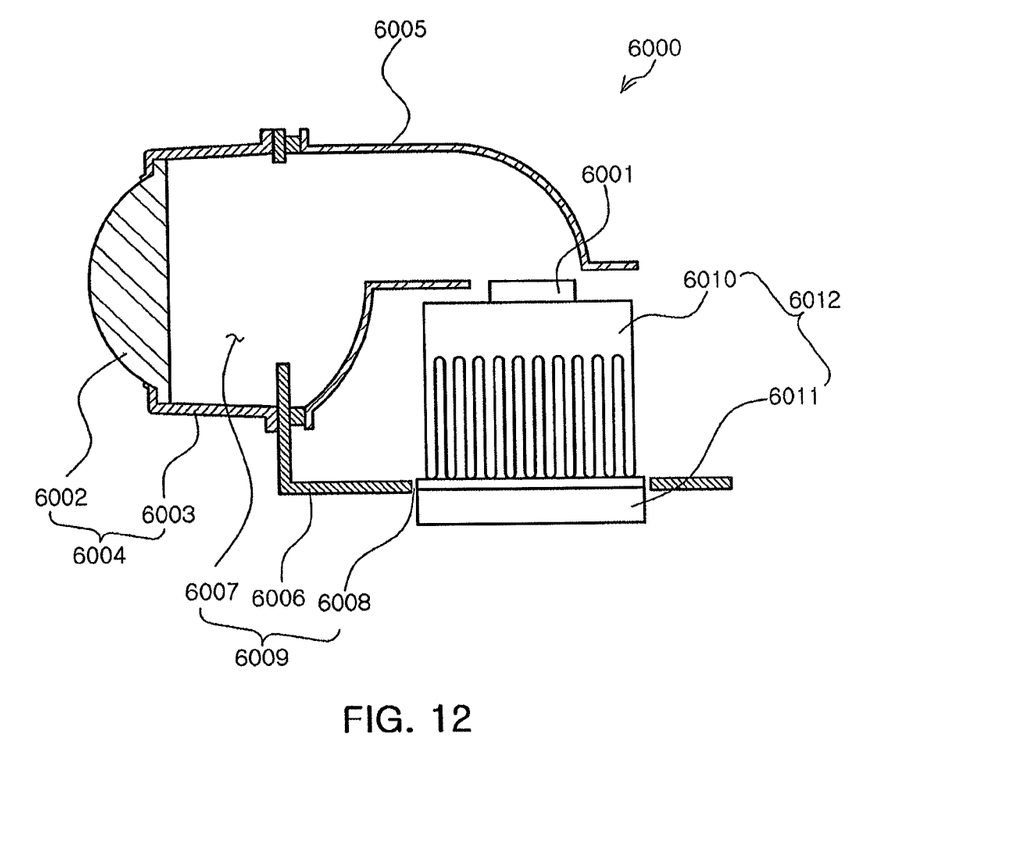
FIG. 12 illustrates an example in which a semiconductor light emitting device according to an embodiment is applied to a vehicle headlight.

FIG. 12 illustrates an example in which a semiconductor light emitting device according to an embodiment is applied to a vehicle headlight. With reference to FIG. 12, a head lamp 6000 for vehicle lighting or the like may include a light source 6001, a reflective unit 6005 and a lens cover unit 6004. The lens cover unit 6004 may include a hollow guide 6003 and a lens 6002. The headlamp 6000 may further include a heat radiating unit 6012 that discharges heat generated in the light source 6001 to the outside. The heat radiating unit 6012 may include a heat sink 6010 and a cooling fan 6011 to perform effective heat emission. In addition, the headlamp 6000 may include a housing 6009 fixing and supporting the heat radiating unit 6012 and the reflective unit 6005. The housing 6009 may include a central hole 6008 to facilitate coupling of the heat radiating unit 6012 to one surface thereof. Further, the housing 6009 may include a front hole 6007 in another surface integrally connected to the one surface to then be bent in a direction orthogonal thereto, through which the reflective unit 6005 is fixed to be disposed over the light source 6001. Whereby, the front side thereof is open by the reflective unit 6005, and the reflective unit 6005 is fixed to the housing 6009 such that the open front side corresponds to the front hole 6007, whereby light reflected through the reflective unit 6005 may pass through the front hole 6007 to be then emitted externally.

By way of summation and review, as LEDs have come into widespread use, a range of uses thereof may be broadened to encompass the field of high current, high output light sources. As described above, as LEDs are used in the field of high current, high output light sources, improving light emitting characteristics has been considered. For example, improving growth conditions for multiple quantum well (MQW) structures and improving the crystalline properties of a semiconductor layer have been considered. For example, in order to increase light efficiency through an improvement in crystalline properties and an increase in a light emission region, a light emitting device including a nanoscale light emitting structure and a manufacturing technology thereof has been considered.

An embodiment provides a semiconductor light emitting device capable of reducing and/or preventing occurrence of a leakage current by forming a nanoscale light emitting structure inside an opening of an insulating layer.

The embodiments provide a semiconductor light emitting device capable of preventing a delamination phenomenon such as a leakage current in a semiconductor light emitting device including a nanoscale light emitting structure, that may otherwise occur between a nanoscale light emitting structure and an insulating layer due to a difference in degrees of stress applied to an interior and an exterior of an opening of an insulation layer, for defining a diameter of the nanoscale light emitting structure, during a growth process of the nanoscale light emitting structure when manufacturing a limiting device including a nanoscale light emitting structure.

While the inventive concept has been shown and described in connection with embodiments, it will be apparent to those skilled in the art that modifications and variations could be made without departing from the spirit and scope of the present inventive concept as defined by the appended claims. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
a first conductive semiconductor base layer on a substrate;
an insulating layer on the first conductive semiconductor base layer, the insulating layer including a plurality of openings through which the first conductive semiconductor base layer is exposed; and
a plurality of nanoscale light emitting structures on the first conductive semiconductor base layer, the nanoscale light emitting structures respectively including a first conductive semiconductor core on an exposed region of the first conductive semiconductor base layer, and an active layer, and a second conductive semiconductor layer sequentially disposed on a surface of the first conductive semiconductor core,
wherein a lower edge of a side portion of the first conductive semiconductor core, a lower edge of a side portion of the active layer, and a lower edge of a side portion of the second conductive semiconductor layer of each nanoscale light emitting structure is on an inner side wall of the opening in the insulating layer.

2. The semiconductor light emitting device as claimed in claim 1, wherein the inner side wall of the opening is inclined at a predetermined angle such that a cross sectional area of the opening is gradually increased in an upward direction.

3. The semiconductor light emitting device as claimed in claim 2, wherein the predetermined angle of the inner side wall is greater than 15 degrees and less than 75 degrees.

4. The semiconductor light emitting device as claimed in claim 2, wherein each nanoscale light emitting structure includes a plurality of semi-polar surfaces.

5. The semiconductor light emitting device as claimed in claim 2, wherein:
each nanoscale light emitting structure has a hexagonal pyramid shape, and
an inclined side portion of the hexagonal pyramid is a semi-polar surface.

6. The semiconductor light emitting device as claimed in claim 2, wherein:
a lower part of each nanoscale light emitting structure has an inclined side portion of which a cross sectional area is reduced in a growth direction, and
an upper part of each nanoscale light emitting structure has a rod form.

7. The semiconductor light emitting device as claimed in claim 6, wherein the inclined side portion of the lower part of the nanoscale light emitting structure is a semi-polar surface.

8. The semiconductor light emitting device as claimed in claim 2, wherein each nanoscale light emitting structure has a rod form.

9. The semiconductor light emitting device as claimed in claim 1, wherein the inner side wall of the opening is approximately perpendicular with respect to a surface of the substrate.

10. The semiconductor light emitting device as claimed in claim 9, wherein each nanoscale light emitting structure includes a plurality of semi-polar surfaces.

11. The semiconductor light emitting device as claimed in claim 9, wherein:
each nanoscale light emitting structure has a hexagonal pyramid shape, and
an inclined side portion of the hexagonal pyramid is a semi-polar surface.

12. The semiconductor light emitting device as claimed in claim 9, wherein:
a lower part of each nanoscale light emitting structure has an inclined side portion of which a cross sectional area is reduced in a growth direction, and
an upper part of each nanoscale light emitting structure has a rod form.

13. A semiconductor light emitting device, comprising:
a first conductive semiconductor base layer on a substrate;
an insulating layer on the first conductive semiconductor base layer, the insulating layer including a plurality of openings therein and through which the first conductive semiconductor base layer is exposed; and
a plurality of nanoscale light emitting structures in the plurality of openings, the nanoscale light emitting structures respectively including a first conductive semiconductor core on the first conductive semiconductor base layer, an active layer, and a second conductive semiconductor layer,
wherein:
an inner side wall of the opening is inclined at a predetermined angle such that a cross-sectional area of the opening is gradually increased in an upward direction,
the plurality of nanoscale light emitting structures include a plurality of semi-polar surfaces, and
a lower edge of a side portion of each nanoscale light emitting structure is on the inclined inner side wall of the opening.

14. The semiconductor light emitting device as claimed in claim 13, wherein the predetermined angle of the inner side wall is greater than 15 degrees and less than 75 degrees.

15. The semiconductor light emitting device as claimed in claim 13, wherein the nanoscale light emitting structure has a hexagonal pyramid shape.

16. A semiconductor light emitting device, comprising:
a first conductive semiconductor base layer on a substrate;
an insulating layer on the first conductive semiconductor base layer, the insulating layer including a plurality of openings overlying the first conductive semiconductor base layer; and
a plurality of nanoscale light emitting structures on the first conductive semiconductor base layer in the openings, the nanoscale light emitting structures each including a first conductive semiconductor core on the first conductive semiconductor base layer, an active layer on the first conductive semiconductor core, and a second conductive semiconductor layer on the active layer,
wherein a lower part of each nanoscale light emitting structure has an inclined side portion of which a cross sectional area is reduced in a growth direction, and an upper part of each nanoscale light emitting structure has a rod form, and
wherein a lower edge of a side portion of each nanoscale light emitting structure contacts an inner side wall of the opening in the insulating layer.

17. The semiconductor light emitting device as claimed in claim 16, wherein at least one of the side portion of each nanoscale light emitting structure or the inner side wall of the opening in the insulating layer is inclined with respect to a plane of an upper surface of the substrate.

18. The semiconductor light emitting device as claimed in claim 17, wherein both of the side portion of each nanoscale light emitting structure and the inner side wall of the opening in the insulating layer are inclined with respect to the plane of the upper surface of the substrate.

19. The semiconductor light emitting device as claimed in claim 17, wherein:
the inner side wall of the opening is inclined at a predetermined angle with respect to the plane of the upper surface of the substrate such that a cross sectional area of the opening is gradually increased in a direction away from the substrate, and
the predetermined angle of the inner side wall is greater than 15 degrees and less than 75 degrees.

20. The semiconductor light emitting device as claimed in claim 16, wherein each nanoscale light emitting structure includes a plurality of semi-polar surfaces.

* * * * *